United States Patent
Kazi et al.

(10) Patent No.: US 7,772,831 B2
(45) Date of Patent: *Aug. 10, 2010

(54) SYSTEMS AND METHODS FOR TESTING PACKAGED DIES

(75) Inventors: Tauseef Kazi, San Diego, CA (US); Jeff Gemar, San Diego, CA (US); Vaishnav Srinivas, San Diego, CA (US); Vivek Mohan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 791 days.

This patent is subject to a terminal disclaimer.

(21) Appl. No.: 11/436,452

(22) Filed: May 18, 2006

(65) Prior Publication Data

US 2006/0214276 A1 Sep. 28, 2006

Related U.S. Application Data (62) Division of application No. 10/830,910, filed on Apr. 22, 2004, now Pat. No. 7,075,175.

(51) Int. Cl.
*H01L 23/02* (2006.01)
*G01R 31/26* (2006.01)
(52) U.S. Cl. ............... 324/158.1; 324/765; 257/678
(58) Field of Classification Search .......... None
See application file for complete search history.

(56) References Cited

U.S. PATENT DOCUMENTS 6,205,082 B1 3/2001 Tomita et al.
6,496,030 B1 12/2002 Kaneko
6,724,237 B2 4/2004 Yamashita et al.
6,762,486 B2 7/2004 Inoue et al.
6,794,914 B2 * 9/2004 Sani et al. ............... 327/202

(Continued)

FOREIGN PATENT DOCUMENTS

EP 0838760 4/1998

(Continued)

OTHER PUBLICATIONS

International Preliminary Report on Patentability-PCT/US05/010780, IPEA/US-Mar. 3, 2007.

(Continued)

*Primary Examiner*—Paresh Patel
(74) *Attorney, Agent, or Firm*—Peter M. Kamarchik; Nicholas J. Pauley; Sam Talpalatsky (57) ABSTRACT

A main die and a stacked die are included in the same component package. A transmission gate (370) is implemented on the main die, and can be enabled to receive leakage current in a connection (318) between the main die and the stacked die, and to conduct the leakage current to a bonding pad (344) that is accessible external to the package. Thus, the connectivity between the main die and the stacked die can be tested after the dies are packaged. The transmission gate is disabled during high-speed testing and normal operation. The package can also include a multiplexer (364) that is enabled during high-speed testing to input and output test signals at the package level. A direction signal is used to indicate whether test signals are being input to or output from the main die.

20 Claims, 5 Drawing Sheets

U.S. PATENT DOCUMENTS 7,075,175 B2 * 7/2006 Kazi et al. ............. 257/678
2002/0105825 A1 * 8/2002 Marshall et al. ............. 365/154

FOREIGN PATENT DOCUMENTS

WO 0029860 5/2000

OTHER PUBLICATIONS

International Search Report-PCT/US05/010780, International Search Authority-European Patent Office-Jun. 28, 2005.

Written Opinion-PCT/US05/010780, International Search Authority-European Patent Office-Jun. 28, 2005.

* cited by examiner

SYSTEMS AND METHODS FOR TESTING PACKAGED DIES

CLAIM OF PRIORITY UNDER 35 U.S.C. §120

The present Application for Patent is a divisional of patent application Ser. No. 10/830,910 entitled "SYSTEMS AND METHODS FOR TESTING PACKAGED DIES" filed Apr. 22, 2004 now U.S. Pat. No. 7,075,175, and assigned to the assignee hereof and hereby expressly incorporated by reference herein.

BACKGROUND

Microprocessing devices often need access to external memory to store data and program instructions. In some devices, the memory device is external to the package and communicates with the microprocessor through an external interface. As memory requirements continues to increase, additional memory devices are often required to meet speed and bandwidth requirements. Interfacing to the external memory devices requires more pins on the package, as well as additional space within the equipment in which the microprocessor and memory devices are being used. The additional memory device may therefore result in a relatively significant increase in cost. A more cost efficient alternative would be to stack the additional memory device inside the package with the microprocessor.

Microprocessor and memory devices are typically configured on a silicon wafer referred to as a die. Several dies may be stacked in a single package and sold as an integrated circuit. Pins are located outside the package to allow the devices in the package to be electrically coupled with other devices. While some of the pins may be allocated for external interfaces to test the dies in the package, it is typically desirable to allocate as many of the pins as possible to other types of signals, such as control, data, power, and ground signals.

As integrated circuit technology scales down, the supply voltage must be reduced to prevent breakdown of gate insulators in electronic components. Voltage reduction has the added benefit of reducing the dynamic power consumption in an integrated circuit. Voltage downscaling also results, however, in a linear increase in the propagation delay of the logic gates. Therefore, the threshold voltage of the transistors must be lowered to maintain the circuit speed. This reduction in threshold voltage results in a significant increase in the leakage current, which increases the static power consumption in the circuit.

Each of the dies in the stack is typically tested comprehensively before packaging. The dies can potentially be damaged during assembly, however, and additional testing must be performed once the dies are packaged together. Most failures are due to mechanical stress and/or electrostatic discharge, which can cause additional leakage current at one or more of the pins. Leakage current can drain power supplies in battery powered devices more rapidly than necessary. It is therefore desirable to test packaged devices under expected operating conditions at the package level to insure the devices are performing within allowable parameters.

Most suppliers of integrated circuit devices stack memory dies to eliminate the external memory devices altogether. Such configurations leave the external interface pins unused. Accordingly, the unused pins can be tied to the stacked memory interface, allowing full access to the stacked device at package level for comprehensive testing.

In some configurations, however, an external memory system can be supplemented with a stacked memory die. As a result, there are no spare pins available on the package to access the memory signals of the stacked die. Since there are no dedicated pins, some pins on the package are shared between the stacked die signals along with signals on the main die.

Figure 1:
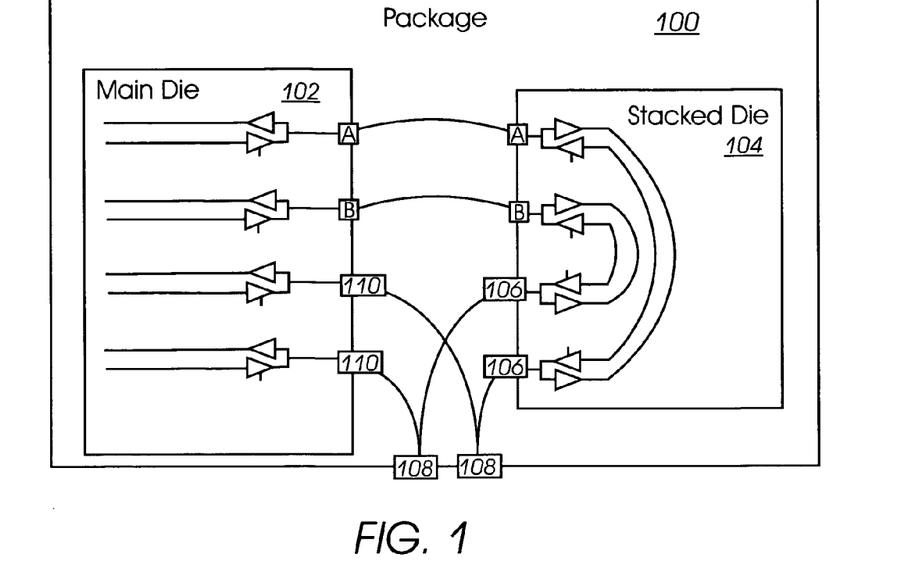
FIG. 1 is a diagram of an embodiment of a known package configuration that allows testing of a main die and a stacked die.

FIG. 1 shows one known configuration of an electronic component package 100 that allows testing of a main die 102 and a stacked die 104. Special test pads 106 are added to the stacked die 104 and are bonded to external pins 108 on the package 100 along with other functional pads 110 of the main die 102. The stacked die test pads 106 are disabled during normal functional mode, while the functional pads 110 on the main die 102 are disabled in test mode. One drawback of this configuration of package 100 is the addition of extra test pads 106 on the stacked die 104, which adds extra cost.

Figure 2:
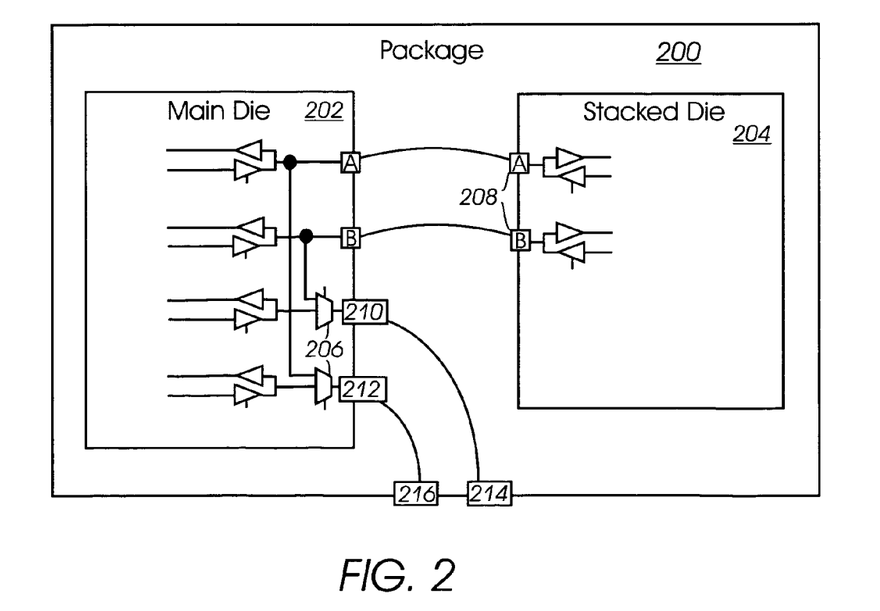
FIG. 2 is a diagram of another embodiment of a known package configuration that allows testing of a main die and a stacked die.

FIG. 2 shows another electronic component package 200 that allows testing of main die 202 and stacked die 204 without requiring the special test pads 106. Instead, analog multiplexers 206 are coupled to combine the signals output to the functional pads 210, 212 of the main die 202 with signals from die-to-die functional pads 208 of the stacked die 204. The multiplexed signals 210, 212 are coupled to respective pins 214, 216 of the package 200. Package 200 allows the stacked die 204 to be tested, but the analog multiplexers 206 must be very large in order to support high speed operation. This not only significantly impacts the speed at which the dies 202, 204 can be tested, but also adds a huge load on the test die-to-die pads 208. The load impacts the speed of operation during normal mode. In summary, while the package 200 allows full test of the stacked die 204 for functionality as well as pin leakage, the testing speed as well as speed during normal operation would be severely restricted by the large analog multiplexers 206.

It is therefore desirable to provide electronic component packages with stacked dies that can be comprehensively tested while alleviating the drawbacks associated with known solutions.

SUMMARY

In some embodiments, an electronic components package includes a first bonding pad (344), a first die (302), and a second die (304) stacked with the first die. A transmission gate (370) configured on the first die includes a control signal input (Test_3). The second die is coupled to the first die via an electrically conductive connection (318). The transmission gate is coupled between the first bonding pad and the connection between the first die and the second die. The transmission gate is enabled or disabled based on the control signal input to conduct leakage current in the connection between the first die and the second die. The leakage current can be monitored via the first bonding pad.

In other embodiments, a method for testing packaged electronic components includes enabling a transmission gate (370). The transmission gate is implemented on a first die, and is configured to receive leakage current in a connection (318) between the first die and a second die. The transmission gate is also configured to conduct the leakage current to a bonding pad that accessible external to a package that includes the first and second dies. An output buffer (310) configured on the first die is coupled to provide signals to the connection between the first die and the second die when the transmission gate is disabled. The transmission gate is coupled in parallel to the output buffer between the output buffer and the connection between the first die and the second die. Disabling the output buffer prevents signals from the main die from interfering with the leakage current testing.

In other embodiments, an electronic die includes a first bonding pad (314), a second bonding pad (332), and a transmission gate (370) coupled in parallel between the first bonding pad and the second bonding pad. An output buffer (310) is coupled in series with the first bonding pad and is configured to receive input from other components on the main die. The output buffer is disabled when the transmission gate is enabled to conduct leakage current from the first bonding pad to the second bonding pad.

In further embodiments, an electronic apparatus includes a first die, and a second die stacked with the first die. The first die and the second die are included in the same component package. The apparatus includes means for enabling and disabling a transmission gate (370) implemented on the first die. The transmission gate can be enabled to receive leakage current in a connection (318) between the first die and the second die, and to conduct the leakage current to a bonding pad (344) that is accessible external to the package. The apparatus can also include means for enabling and disabling a multiplexer (364). The transmission gate is disabled and the multiplexer is enabled during high-speed testing, and the multiplexer is configured to provide signals, communicated from the second die to the first die, to the bonding pad.

These and other embodiments will be understood upon an understanding of the present disclosure by one of ordinary skill in the art to which it pertains.

BRIEF DESCRIPTION OF THE DRAWINGS

The accompanying drawings, which are incorporated in and form a part of this specification, illustrate embodiments of the invention and, together with the description, serve to explain its principles.

DETAILED DESCRIPTION

Figure 3:
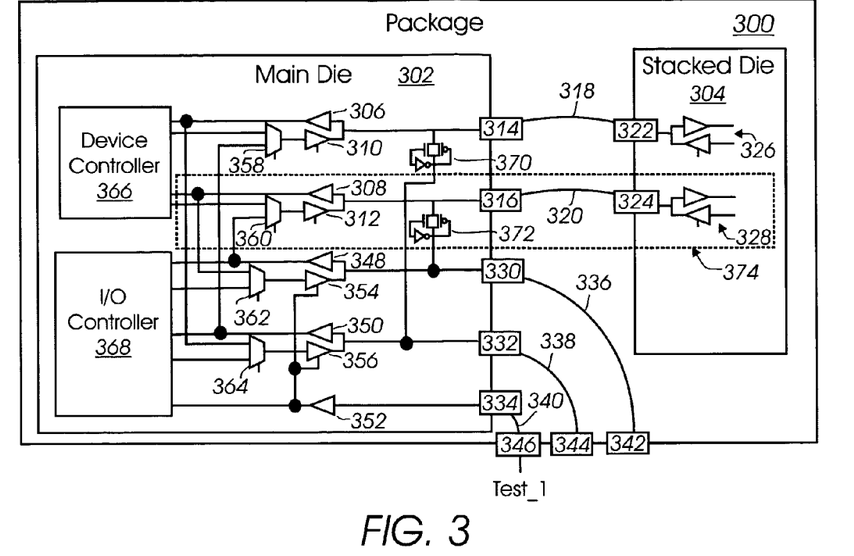
FIG. 3 is a diagram of an embodiment of an electronics components package configured for normal operation, leakage current testing, and high-speed testing.

Referring now to FIG. 3, an embodiment of an electronics component package 300 is shown that allows a main die 302 and a stacked die 304 to be tested functionally, as well as for current leakage. In some embodiments, the package 300 supports normal operating modes, high-speed testing of the main die 302 and the stacked die 304, and leakage current testing of the connections between the main die 302 and the stacked die 304. The unique configuration of components in the package 300 allows signal strength and operating speed to be retained during high-speed tests and normal operating modes, even at high frequencies. The configuration of components in the package 300 can also alleviate the need for additional test pads, such as test pads 106 in FIG. 1, on the stacked die 304, which can lower the relative cost of manufacturing the stacked die 304.

In some embodiments, the main die 302 is configured with input buffers 306, 308 that are paired with corresponding output buffers 310, 312 for bi-directional communication with the stacked die 304 via respective bonding pads 314, 316 and connections 318, 320. The output buffers 310, 312 are also configured to receive a control input that can be used to tri-state (i.e., place in a non-conducting state) the output buffers 310, 312 during leakage testing.

The stacked die 304 includes bonding pads 322, 324 coupled to the wire connections 318, 320 and to respective pairs of input/output buffer pairs 326, 328. Connectivity problems between the bonding pads 314, 316 on the main die 302 and the bonding pads 322, 324 on the stacked die 304 can be discovered during leakage tests, as further described herein.

The main die 302 also includes a number of bonding pads 330, 332, 334 that are coupled via wire connections 336, 338, 340 to corresponding bonding pads 342, 344, 346 on the package 300. The package bonding pads 342, 344, 346 are typically connected to pins (not shown) that are accessible external to the package 300. Input buffers 348, 350, 352 are coupled to receive signals via corresponding bonding pads 330, 332, 334. Output buffers 354, 356 are coupled to transmit signals to corresponding bonding pads 330, 332.

A direction signal can be applied at the bonding pad 346 to indicate whether signals are being input or output at the package bonding pads 342, 344. The direction signal can be a high-impedance signal that is applied to a control input of the output buffers 310, 312, 354, 356 to prevent the output buffers 310, 312, 354, 356 from conducting when test signals are input at the package bonding pads 342, 344.

The main die 302 can also include multiplexers 358, 360, 362, 364 coupled to provide input to corresponding output buffers 310, 312, 354, 356. Multiplexers 358, 360 are each coupled to receive input signals including: (a) input signals from other components on the main die 302, such as device controller 366, during normal operating modes; and (b) input signals from the corresponding input buffers 350, 348, which are used during high-speed testing. Device controller 366 can be any suitable control device. For example, the device controller 366 can be a memory controller when the main die 302 incorporates a memory device. The multiplexers 362, 364 are coupled to receive input signals including: (a) input signals from other components on the main die 302, such as general purpose input/output controller 368 or other suitable device, during normal operating modes; and (b) input signals from the corresponding input buffers 308, 306 during high-speed testing. Test signal inputs can also be coupled to control operation of the multiplexers 358, 360, 362, 364 during various test modes, as further described herein.

Figure 4:
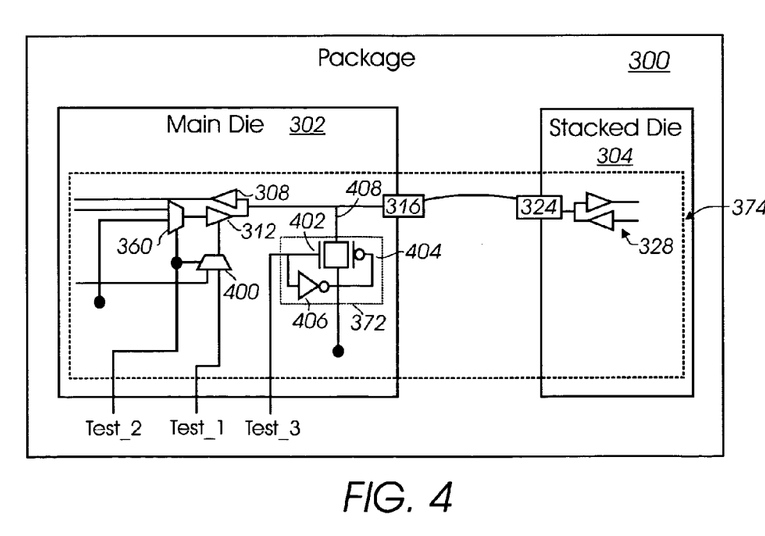
FIG. 4 is a diagram showing further detail of some the components in the package shown in FIG. 3.

Referring to FIGS. 3 and 4, FIG. 4 shows further detail of an embodiment of a subgroup 374 of components that can be included in the package 300. The output buffers 310, 312, 354, 356 are typically tri-stated during leakage testing to avoid interference with the leakage current signals, as further described herein. FIG. 4 also shows control input TEST_2 that can be coupled to provide different inputs to the multiplexers 360, 358, 362, 364 for normal operation or high-speed testing. The control signals can be accessed within and/or external to the package 300.

A multiplexer 400 can be coupled to enable or disable the output buffer 312. The multiplexer 400 can be coupled to receive inputs from the device controller 366 and the TEST_1 signal. The TEST_2 signal can be used to select between the inputs to the multiplexer 400, as well as to enable or disable the multiplexer 360. Other multiplexers (not shown) can be similarly coupled to enable/disable respective multiplexer 358, 362, 364, and to select between input signals to respective output buffers 310, 354, 356.

The main die 302 can also include a transmission gate 370 coupled between the connection to the bonding pad 314 and the connection to bonding pad 332. Another transmission gate 372 can be coupled between the connection to bonding pad 316 and the connection to bonding pad 330. The transmission gates 370, 372 are enabled during leakage testing to allow any leakage current between bonding pads 314, 322, and/or bonding pads 316, 324 to be detected at the package bonding pads 344, 342, respectively.

Note that the main die 302 and the stacked die 304 are shown with a limited number of die-to-die connections, transmission gates, buffers, multiplexers, and package bond pads for purposes of illustration, and that additional components can be included in other embodiments.

In the embodiment shown in FIG. 4, transmission gate 370 comprises an n-channel circuit 402 coupled to a p-channel circuit 404, and an inverter 406 coupled between the gates of the p-channel circuit 404 and the n-channel circuit 402. The transmission gate 370 conducts when a high level is applied to the gate of the n-channel circuit 402 and a low level is applied to the gate of the p-channel circuit 404. The digital inverter 406 inverts a HIGH input to a LOW output, and vice versa. Thus, when a control signal input (labeled TEST_3) to the inverter 406 is HIGH, the transmission gate 370 functions as an analog switch for signals on connection 408 at levels between the supply voltage (Vdd) for the p-channel circuit 404 and ground. The transmission gate 372 functions similar to the transmission gate 370, and any of a variety of suitable transmission gates can be utilized as the transmission gates 370, 372. The control signal inputs can be configured to be accessed within and/or external to package 300.

The transmission gates 370, 372 allow the leakage current at pads 314, 322, and 316, 324, respectively, to be measured. The transmission gates 370, 372 can be configured to conduct any amount of leakage current, however, the leakage current is ideally within range of a few micro-amperes. Accordingly, the n-channel circuit 402 and the p-channel circuit 404 can include relatively small transistor components, which cause minimal impact on loading or speed during normal operation.

Referring again to FIG. 3, each of the main die 302 and the stacked die 304 may be individually tested (e.g., at the wafer level) to ensure proper functionality of the circuits fabricated on the dies 302, 304. After the dies 302, 304 have been stacked, interconnected, and encapsulated within the package 300, additional testing may be performed to ensure that the main die 302 and the stacked die 304 were not damaged during the assembly of the package 300, and that the connections 318, 320 are functional.

Referring to FIGS. 3 and 4, the connections to the TEST_1, TEST_2, and TEST_3 signals can be brought to pins on the package 300 to enable control of the test modes. The configuration of the main die 302 and the stacked die 304 in the package 300 supports normal operation as well as high frequency, high-speed test using the digital multiplexers 358, 360, 362, 364, and the leakage current test using the transmission gates 370, 372.

In the embodiment shown, the TEST_1, TEST_2, and TEST_3 signals can be configured to control the state of respective transmission gates 370, 372; buffers 306, 308; and multiplexers 358, 360, 362, 364. Alternatively, multiple TEST_1, TEST_2, and TEST_3 signals can be implemented to control one or more of the respective components independently of the others. Such a configuration would allow, for example, the connection 318 to be tested independently of the connection 320. In some embodiments, the settings shown in Table 1 can be used to configure the test modes and normal operation for the main die 302. In Table 1, High indicates that a signal is asserted, and Low indicates that a signal is not asserted on the corresponding pins.

TABLE 1

|  | TEST_1 | TEST_2 | TEST_3 |
|---|---|---|---|
| Normal Operation | HIGH or LOW | LOW | LOW |
| High-speed Test (Read) | LOW | HIGH | LOW |
| High-speed Test (Write) | HIGH | HIGH | LOW |
| Leakage Test | LOW | HIGH | HIGH |

Figure 5:
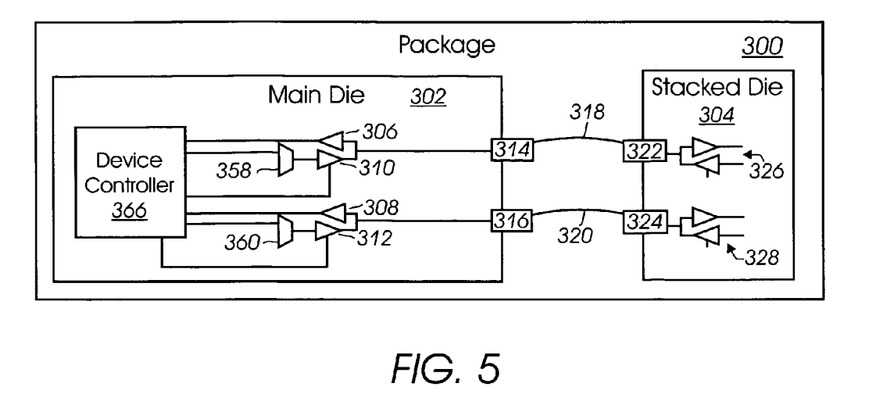
FIG. 5 shows the signal paths on the main die of FIG. 3 that are used during normal operation.

Referring to FIGS. 3, 4, and 5, FIG. 5 shows the signal paths on the main die 302 that are used during normal operation. The value of the TEST_1 control signal can be HIGH or LOW, and the TEST_2 control signal is set LOW to disable the multiplexers 358, 360, and to enable or disable operation of the output buffers 310, 312 based on whether data is being sent or received by the main die 302. The TEST_3 control signal is also set LOW during normal operation to disable the transmission gates 370, 372.

Figure 6:
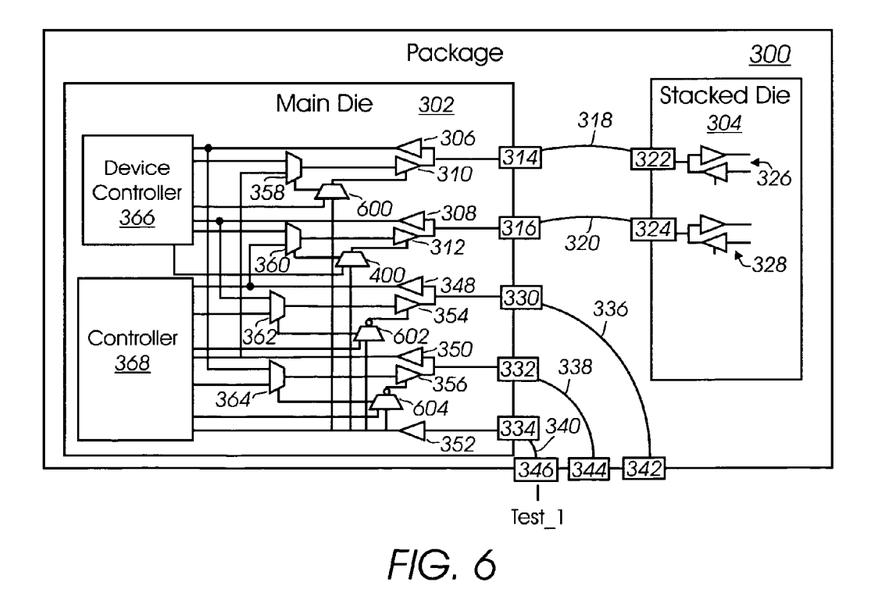
FIG. 6 shows the signal paths on the main die of FIG. 3 that are used during high-speed test modes.

Referring to FIGS. 3 and 6, FIG. 6 shows the signal paths on the main die 302 that are used during high-speed test modes, which include test signals being input to and output from the main die 302. In the embodiment of the package 300 shown, signals can be input and output at the package bonding pads 342, 344 during high-speed testing.

When test signals are output from the main die 302 to the stacked die 304 during high-speed write test, test input signals can be applied at pads 344, 342. The TEST_1 control signal is HIGH to enable the multiplexers 358, 360, 362, 364. The TEST_2 control signal is set HIGH to enable the multiplexers 400, 600, 602, 604 and the output buffers 310, 312, and to disable operation of the output buffers 354, 356. The TEST_3 control signal is set LOW to disable the transmission gates 370, 372.

When test signals are input to the main die 302 from the stacked die 304 during high-speed read test, test output signals can be monitored at pads 344, 342. The TEST_1 control signal is LOW to disable the multiplexers 358, 360, 362, 364. The TEST_2 control signal is set LOW to disable the multiplexers 400, 600, 602, 604, and the output buffers 310, 312, and to enable operation of the output buffers 354, 356. The TEST_3 control signal is set LOW to disable the transmission gates 370, 372.

Notably, the configuration allows the main die 302 and the stacked die 304 to operate at normal speed without any overhead associated with the logic for the transmission gates 370, 372 during high-speed test modes.

Figure 7:
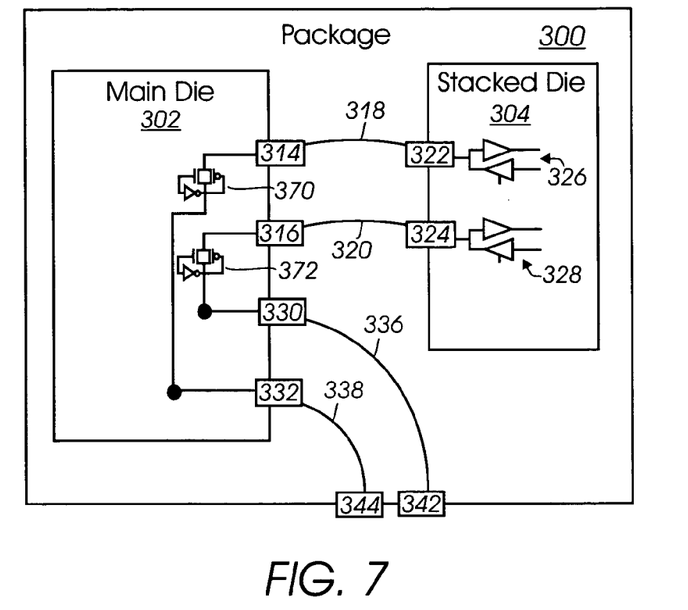
FIG. 7 shows the signal paths on the main die of FIG. 3 that are used during leakage test mode.

Referring to FIGS. 3, 6, and 7, FIG. 7 shows the signal paths on the main die 302 that are used during leakage testing. The TEST_2 and TEST_3 signals are HIGH to enable the multiplexers 400, 600, 602, 604, and the transmission gates 370, 372, and to disable operation of the output buffers 354, 356. The TEST_1 signal is LOW to disable the output buffers 310, 312. The leakage current in the connections 320, 318 can be monitored in the package bonding pads 342, 344, respectively.

Figure 8:
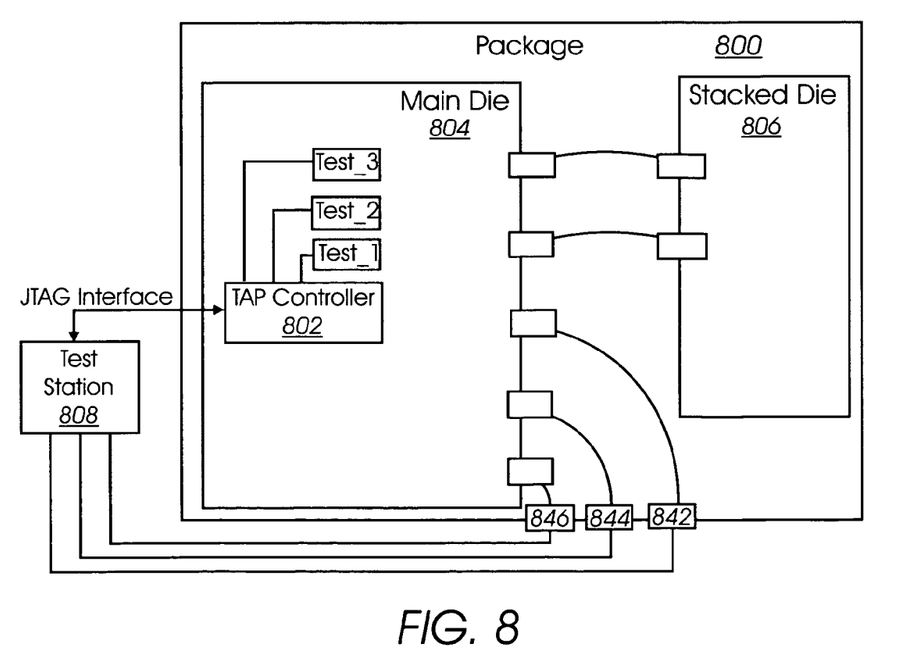
FIG. 8 is a diagram of an embodiment of an electronics component package configured with a Joint Test Action Group (JTAG) Test Access Port (TAP) controller.

Referring to FIG. 8, in other embodiments, a package 800 can be configured for testing with a Joint Test Action Group (JTAG) Test Access Port (TAP) controller 802. The JTAG Specification, known as Institute of Electronic and Electrical Engineers (IEEE) 1149.1, requires JTAG compliant devices to include specified types of pins, such as Test Clock, Test Data In, Test Data Out, Test Mode Select, and an option Test Reset Input. The TAP controller 802 provides access to the test support functions built into the JTAG-compliant package 800. A single cell of a shift-register (not shown) is designed into the logic of the package 800, and linked to every digital pin of the package 800. The single cell links the JTAG circuitry to the internal core logic of the package 800, which can include microprocessors, microcontrollers, programmable logic devices, field programmable gate arrays, application-specific integrated circuits, memory devices, and any other devices that conform to the JTAG specification. Thus, the package 800, a main die 804, and a stacked die 806 can be configured to be JTAG-compliant devices, with TEST_1, TEST_2, and TEST_3 signals controlled via a test station 808 interfaced with the TAP controller 802. Test and direction signals input at the package bonding pads 842, 844, 846 can also be controlled via the test station 808.

Figure 9:
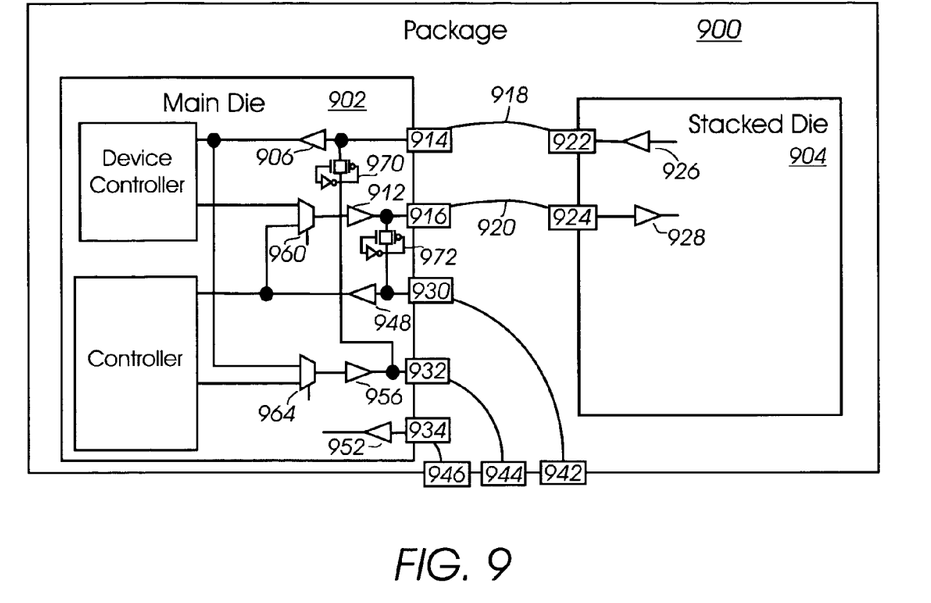
FIG. 9 is a diagram of another embodiment of an electronics component package configured for normal operation, leakage current testing, and high-speed testing.

FIG. 9 shows another embodiment of an electronic component package 900 configured for one-way communication over each connection 918, 920 between a main die 902 and a stacked die 904. The main die 902 includes an input buffer 906 coupled to a bonding pad 914 to receive signals from a bonding pad 922 on the stacked die via the connection 918. The signal from the input buffer 906 is provided to other components on the main die 902 as well as to a multiplexer 964 and to an output buffer 956 that provide the signal to a bonding pad 944 on the package. A transmission gate 970 is coupled in parallel between the input buffer 906 and the bonding pad 914. The transmission gate can be enabled to conduct leakage current on the connection 918 to the bonding pad 932 and the test pad 944.

The main die 902 also includes an output buffer 912 coupled to a bonding pad 916 to receive signals from a multiplexer 960. The multiplexer 960 receives a first input from components on the main die 902, and a second input from a test pad 942 on the package. The test signal from the test pad 942 is can be provided to the multiplexer 960 via a bonding pad 930 and an input buffer 948 on the main die 902. The output buffer 912 transmits the test signal to the stacked die 904 via the connection 920, a bonding pad on the stacked die 904, and an input buffer 928 on the stacked die via the connection 920. A transmission gate 972 is coupled in parallel between the output buffer 912 and the bonding pad 916. The transmission gate 972 can be enabled to conduct leakage current on the connection 920 to the bonding pad 930 and the test pad 942.

A direction signal can be provided via bonding pad 946 on the package 900 to a bonding pad 934 on the main die 902 to an input buffer 952. The direction signal can be used to disable output buffers 956 and 912 during leakage current testing, so that the signals from the output buffers 956, 912 do not interfere with leakage currents.

In high-speed test mode, the multiplexers 960, 964 can be enabled, and transmission gates 970, 972 can be disabled. Test and direction signals can be input to package 900 via test pads 942, 944, 946. The transmission gates 970, 972 can be configured similar to the transmission gates 370, 372 (FIG. 3) described herein. The transmission gates 970, 972, multiplexers 960, 964, and buffers 906, 912, 6948, 956 and 952 can be controlled with test control signals, such as TEST_1, TEST_2, and TEST_3 signals as also described herein.

Logic instructions can be stored on a computer readable medium, or accessed in the form of electronic signals. The logic modules, processing systems, and circuitry described herein may be implemented using any suitable combination of hardware, software, and/or firmware, such as Field Programmable Gate Arrays (FPGAs), Application Specific Integrated Circuit (ASICs), or other suitable devices. The logic modules can be independently implemented or included in one of the other system components. Similarly, other components are disclosed herein as separate and discrete components. These components may, however, be combined to form larger or different software modules, logic modules, integrated circuits, or electrical assemblies, if desired.

Additionally, embodiments of component packages 300, 800, 900 can be utilized in any type of suitable electronic apparatus such as computers, stereo systems, telephones, personal digital assistants, televisions, microwaves, automobiles, machinery, aircraft, and spacecraft, among others. Further transmission gates 370, 372; multiplexers, 358, 360, 362, 364; buffers 306, 310, 308, 312, 348, 354, 350, 356, 352; and test pads 342, 344, 346 can be configured on the stacked die 304, 904 in addition to, or instead of, the main die 302, 902 to implement normal operation, high-speed testing capabilities, and leakage current testing capabilities. Main die 302, 902 and stacked die 304, 904 can be any suitable type of analog, digital, or combination of analog and digital devices, such as memory and/or processing devices.

While the present disclosure describes various embodiments, these embodiments are to be understood as illustrative and do not limit the claim scope. Many variations, modifications, additions and improvements of the described embodiments are possible. For example, those having ordinary skill in the art will readily implement the processes necessary to provide the structures and methods disclosed herein. Variations and modifications of the embodiments disclosed herein may also be made while remaining within the scope of the following claims. The functionality and combinations of functionality of the individual modules can be any appropriate functionality. In the claims, unless otherwise indicated the article "a" is to refer to "one or more than one".

What is claimed is:

1. A method for testing packaged electronic components, comprising:
    enabling a transmission gate, wherein the transmission gate is implemented on a first die, and the transmission gate is configured to receive leakage current in a connection between the first die and a second die, and to conduct the leakage current to a connection that is accessible external to a package that includes the first and second dies; and
    disabling an output buffer configured on the first die, wherein the output buffer is coupled to provide signals to the connection between the first die and the second die, and the transmission gate is coupled in parallel with the output buffer, further wherein disabling the output buffer prevents signals from the first die from interfering with the leakage current.

2. The method of claim 1, further comprising:
    disabling the transmission gate; and
    enabling a multiplexer and the output buffer during high-speed testing, wherein the multiplexer is configured on the first die to provide signals to the output buffer.

3. The method of claim 2, further comprising:
controlling at least one of the transmission gate, the output buffer, and the multiplexer, via a TAP controller.

4. The method of claim 1, further comprising:
providing a direction signal indicating whether test signals are being input to or output from the first die; and
disabling a second output buffer when the direction signal indicates that test signals are being input to the first die.

5. The method of claim 4, further comprising:
enabling a second multiplexer configured on the first die, wherein the second multiplexer is coupled to receive signals from the connection between the first die and the second die, and to output signals to the second output buffer; and
enabling the second output buffer when the direction signal indicates that test signals are being output from the first die, wherein the test signals are output to a connection that is accessible external to the package.

6. The method of claim 1, further comprising:
controlling at least one of the transmission gate, the output buffer, and the multiplexer, via ports accessible externally to the package.

7. The method of claim 1, further comprising:
enabling and disabling the transmission gate, the output buffer, and the multiplexer based on whether the package is in normal operating mode, high-speed test mode, or leakage current test mode.

8. An electronic apparatus, comprising:
a first external connection;
a second external connection;
a transmission gate coupled in parallel between the first external connection and the second external connection on a main die; and
an output buffer coupled in series with the first external connection and configured to receive input from other components on the main die, wherein the output buffer is disabled when the transmission gate is enabled to conduct leakage current from the first external connection to the second external connection.

9. The apparatus of claim 8, wherein the transmission gate includes a p-channel circuit, an n-channel circuit, and an inverter coupled between the p-channel circuit and the n-channel circuit.

10. The apparatus of claim 8, further comprising:
a multiplexer, wherein the multiplexer includes a high-speed test control input, and is configured to receive a first input signal from the first external connection and to output the first input signal to the second external connection when the value of the test control signal indicates high-speed test is occurring.

11. The apparatus of claim 10, further comprising:
a second output buffer coupled between the multiplexer and the second external connection, wherein the second output buffer is configured to output signals to the second external connection, further wherein the second output buffer is configured to receive a direction signal to disable the second output buffer when a signal is being input at the second external connection.

12. The apparatus of claim 8, further comprising:
a third external connection;
an input buffer; and
a connection between the third external connection and the input buffer, wherein the connection conducts a direction signal indicating whether a signal is being input or output at the second external connection.

13. The apparatus of claim 12, further comprising:
a multiplexer, wherein the multiplexer includes a high-speed test control input, and is configured to receive a first input signal from the second external connection and to output the first input signal to the output buffer when the value of the test control signal indicates high-speed test is occurring and the direction signal indicates that a signal is being input at the second external connection.

14. The apparatus of claim 12, further comprising:
an input buffer, wherein the input buffer is configured to receive input from the first external connection and to output the signal to the second external connection when the value of the test control signal indicates high-speed test is occurring and the direction signal indicates that a signal is being output at the second external connection.

15. An electronic apparatus, comprising:
a first die;
a second die stacked with the first die, wherein the first die and the second die are included in the same component package;
means for enabling and disabling a transmission gate, wherein the transmission gate is implemented on the first die, and the transmission gate can be enabled to receive leakage current in a connection between the first die and the second die, and to conduct the leakage current to an external connection that is accessible external to the package; and
means for enabling and disabling a multiplexer, wherein the transmission gate is disabled and the multiplexer is enabled during high-speed testing, and the multiplexer is configured to provide signals, communicated from the second die to the first die, to the external connection.

16. The apparatus of claim 15, further comprising:
means for providing a direction signal indicating whether test signals are being input to or output from the first die; and
means for disabling and enabling an output buffer, wherein the output buffer is disabled when the direction signal indicates that test signals are being input to the first die.

17. The apparatus of claim 16, further comprising:
means for enabling and disabling at least one of the transmission gate, the output buffer, and the multiplexer, via a TAP controller.

18. The apparatus of claim 16, further comprising:
means for enabling and disabling at least one of the transmission gate, the output buffer, and the multiplexer, via ports accessible externally to the package.

19. The apparatus of claim 16, further comprising:
means for enabling and disabling the transmission gate, the output buffer, and the multiplexer based on whether the package is in normal operating mode, high-speed test mode, or leakage current test mode.

20. The apparatus of claim 15, further comprising:
means for enabling during the high-speed testing an output buffer coupled in series with the external connection, wherein the multiplexer is configured to provide the signals to the output buffer.

* * * * *

UNITED STATES PATENT AND TRADEMARK OFFICE
CERTIFICATE OF CORRECTION

PATENT NO. : 7,772,831 B2
APPLICATION NO. : 11/436452
DATED : August 10, 2010
INVENTOR(S) : Kazi et al.

Page 1 of 1

It is certified that error appears in the above-identified patent and that said Letters Patent is hereby corrected as shown below:

Column 9, line 21, claim 6: "the multiplexer," to read as --a multiplexer,--

Column 9, line 25, claim 7: "the multiplexer," to read as --a multiplexer,--

Signed and Sealed this
Twelfth Day of July, 2011

David J. Kappos
*Director of the United States Patent and Trademark Office*